ID 1241B2

United States Patent
Khlat et al.

(10) Patent No.: US 6,931,241 B2
(45) Date of Patent: Aug. 16, 2005

(54) DUAL DIGITAL LOW IF COMPLEX RECEIVER

(75) Inventors: Nadim Khlat, Cugnaux (FR); Stephen Kuffner, Algonquin, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 737 days.

(21) Appl. No.: 09/746,692

(22) Filed: Dec. 21, 2000

(65) Prior Publication Data

US 2001/0014594 A1 Aug. 16, 2001

(30) Foreign Application Priority Data

Dec. 23, 1999 (EP) ............................................. 99403266

(51) Int. Cl.⁷ ............................................... H04B 17/02
(52) U.S. Cl. ...................... 455/137; 455/209; 455/315; 375/324
(58) Field of Search ................................. 455/132, 133, 455/137, 207, 209, 313–315, 303, 304, 552.1, 553.1; 375/316, 322, 324

(56) References Cited

U.S. PATENT DOCUMENTS

| | | | | |
|---|---|---|---|---|
| 5,053,983 A | * | 10/1991 | Hyatt | 708/306 |
| 5,642,358 A | * | 6/1997 | Dent | 370/323 |
| 5,668,837 A | * | 9/1997 | Dent | 375/316 |
| 5,745,846 A | * | 4/1998 | Myer et al. | 455/209 |
| 5,815,525 A | * | 9/1998 | Smith et al. | 375/130 |
| 5,953,641 A | | 9/1999 | Auvray | |
| 6,028,850 A | * | 2/2000 | Kang | 370/320 |
| 6,069,923 A | * | 5/2000 | Ostman et al. | 375/316 |
| 6,157,329 A | * | 12/2000 | Lee et al. | 341/133 |
| 6,160,859 A | * | 12/2000 | Martin et al. | 375/345 |
| 6,219,534 B1 | * | 4/2001 | Torii | 455/303 |
| 6,330,290 B1 | * | 12/2001 | Glas | 375/324 |
| 6,337,885 B1 | * | 1/2002 | Hellberg | 375/316 |
| 6,675,024 B1 | * | 1/2004 | Loke et al. | 455/553.1 |

FOREIGN PATENT DOCUMENTS

| | | |
|---|---|---|
| EP | 0878917 A | 11/1998 |
| WO | WO 9732403 A | 9/1997 |

OTHER PUBLICATIONS

Jian et al., "An Efficient IF Architecture for Dual–Mode GSM/W–CDMA Receiver of a Software Radio," IEEE, pp. 21–24 (1999).
EP99403266 European Search Report.

* cited by examiner

Primary Examiner—Nguyen T. Vo
Assistant Examiner—Nhan T. Le

(57) ABSTRACT

A communications receiver and a method for receiving and processing information transmitted on either a wide band carrier or a narrow band carrier having In-phase-Quadrature-phase (IQ) modulation, comprising, detecting a portion of the spectrum wide enough to encompass the wide band carrier (BW), converting the wide band carrier to baseband in I and Q components, each component having a bandwidth of BW/2, converting the I and Q components into further I and Q components to form components II, IQ, QI, and QQ of bandwidth equal to BW/4, where each of the sub-bands may contain a portion of the originally transmitted information. Operating in wideband mode, each of the components/ is separately processed to extract portions of the originally transmitted information, and operating in a narrowband mode, each of the components containing information is separately processed within the narrow band transmitted carrier to extract portions of the originally transmitted information. The components are then recombined to reconstruct the originally transmitted information.

16 Claims, 5 Drawing Sheets

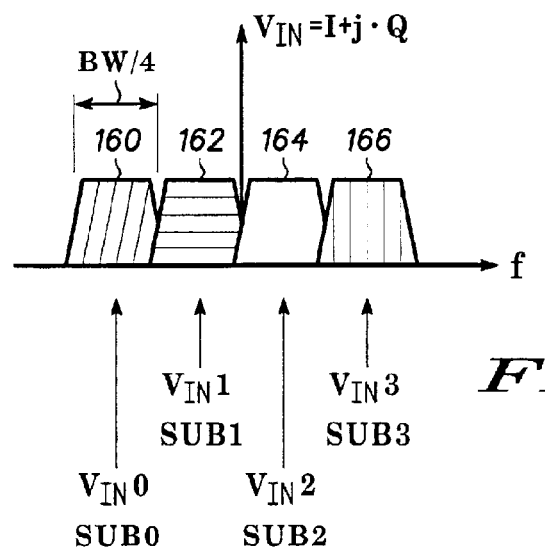
*FIG. 2*
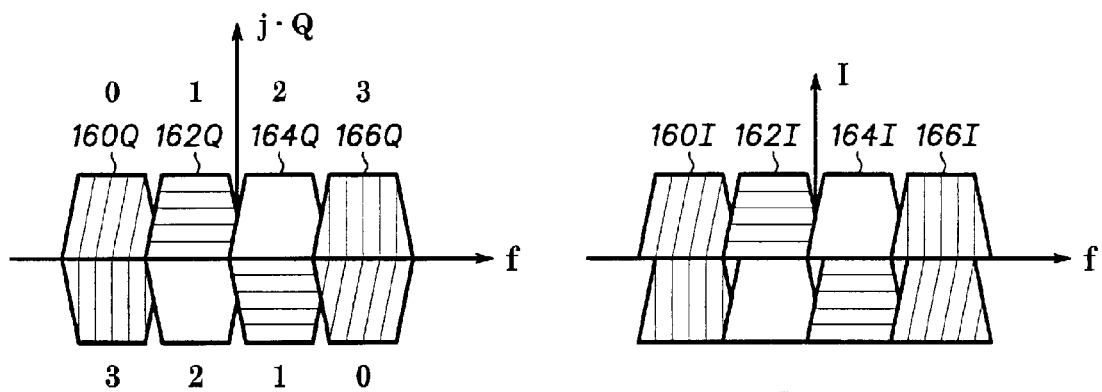
*FIG. 3A*     *FIG. 3B*
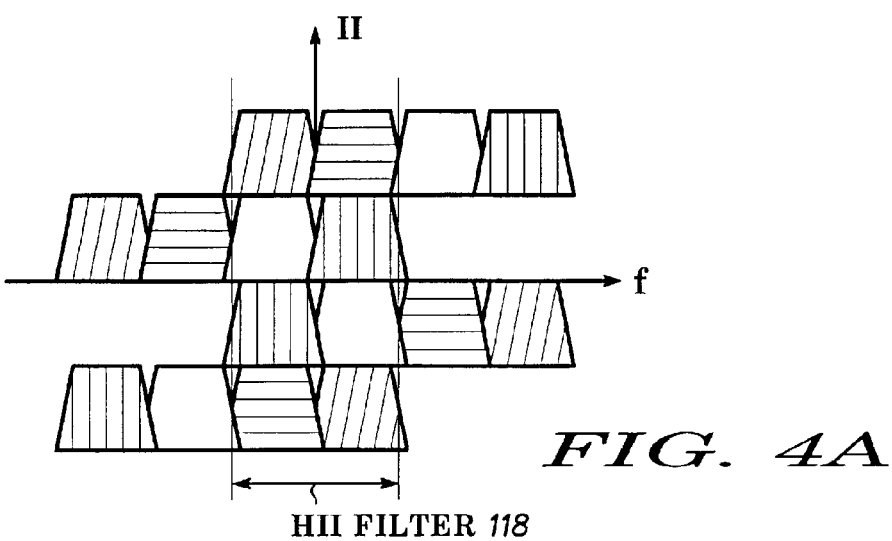
*FIG. 4A*

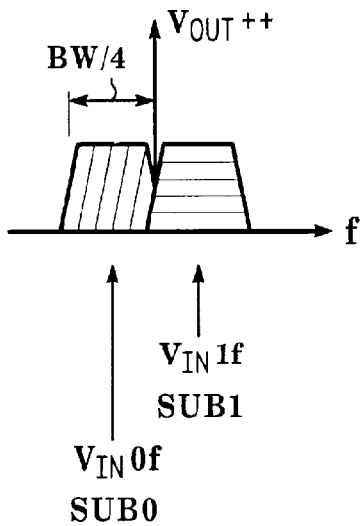
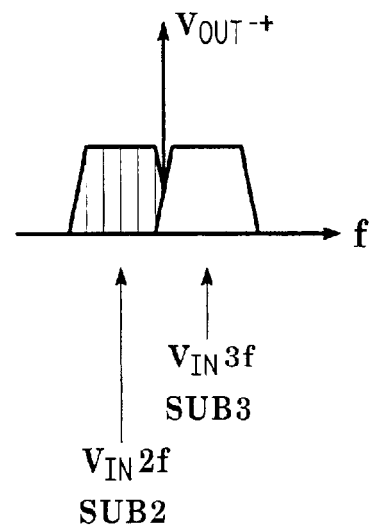
*FIG. 5A*     *FIG. 5B*
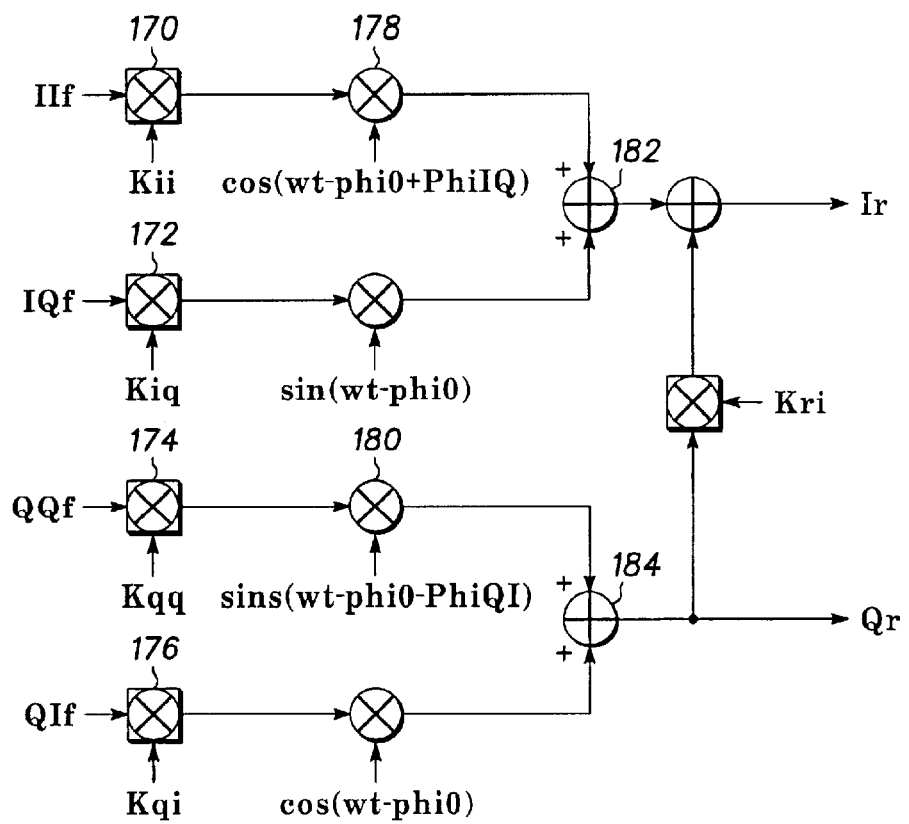
*FIG. 6*

US 6,931,241 B2

DUAL DIGITAL LOW IF COMPLEX RECEIVER

FIELD OF THE INVENTION

This invention relates to communications receivers, and more particularly to receivers capable of receiving wideband signals in a given mode such as Wide Band Code Division Multiple Access (WBCDMA) and also medium or narrow band signals for another mode such as Time Division Multiple Access (TDMA), of which the European cellular telephone system GSM (Global System Mobile) is one example.

BACKGROUND OF THE INVENTION

Present communication systems, for example cellular telephone communication systems, operate on narrow or medium bandwidth technologies. The GSM cellular telephone system, a Time Division Multiple Access (TDMA) system, is one such medium bandwidth system. As requirements for higher speed transmission for, for example, data or video transmission increase, wider band technologies are becoming more desirable. One such wideband technology for cellular communications is Wide Band Code Division Multiple Access (WBCDMA). As new technologies develop it is common to provide communications equipment capable of operating on more than one communications system to facilitate the transition from one system to the other or to allow users access to the combined capacity and features of both systems. Thus there is a need for communications receivers capable of receiving signals from both narrow or medium bandwidth systems and also from wide bandwidth communications systems.

Present efforts to provide a single wideband and medium band receiver have resulted in receiver designs which merely duplicate the receiver circuitry for each mode by providing different receiver data paths for each mode. As an example, in the Wideband CDMA system currently being developed in Europe, Universal Mobile Telephone System (UMTS), the channel bandwidth is 3.84 MHz while the current European cellular system, GSM, has a bandwidth of 200 KHz. Both of these systems operate in an IQ modulation mode wherein information to be transmitted, after being appropriately encoded, is provided in In-phase and Quadrature-phase modulation components superimposed on a carrier signal producing a complex signal which is subsequently demodulated and decoded by the receiver to reveal the originally encoded information.

Currently these two modes are combined into one communications receiver unit by providing two different receiver circuits with different downconversion mixers, blocking filters, amplifiers, antialiasing filters, and analog to digital converters. Each of the receiver circuits is thus a separate receiver capable of receiving and decoding the I and Q components of the transmitted signal. Accordingly, it would be advantageous to provide a single communications receiver capable of operating in several modes and in which many elements of circuitry are usable in each mode, thus reducing the complexity of the receiver by reducing the number of circuits necessary in the receiver.

Since the bandwidth of the WBCDMA UMTS system is 3.84 MHz, each I and Q component of the WBCDMA signal will be in the range of 3.84 Mhz/2. These wide bandwidths, given the required dynamic range of the transmitted signal, require the use of sophisticated data converters such as Flash or Pipelined data converters which, while quite fast thus allowing high sampling rates to accommodate code tracking to recover the transmitted code in a spread spectrum system, are not particularly suitable for the GSM mode since these data converters have high power consumption and have limited dynamic range (10 bits) while the GSM mode requires higher dynamic range (14 bits) but allows lower sampling rates. Lower power consumption, of course, is always desirable in portable or mobile communications equipment such as cellular telephones. The GSM mode allows the use of Sigma-Delta digital to analog converters or other converters which are easily programmable for different bandwidths, have wider dynamic range, and consume less power.

SUMMARY OF THE INVENTION

The above and other advantages can be obtained by superimposing the sub-bands of a wideband channel into narrower bandwidth components called II, IQ, QI, QQ using a dual low Intermediate Frequency (IF) digital approach such that each component is capable of using common data converters that can be reused when a medium or narrow bandwidth mode is selected.

This may be achieved by providing a dual mode communications receiver for detecting and demodulating radio signals carrying information which has been encoded and modulated onto a carrier of either wide or narrow bandwidth for transmission, comprising means for subdividing the detected band into sub-bands and superimposing the sub-bands into a plurality of components with a bandwidth similar to the sub-band bandwidth, means for processing that portion of the information contained in each component separately, and means for combining the processed information from the components to reconstruct the original information transmitted.

This can be accomplished as well by providing a method for operating a dual mode communications receiver for detecting and demodulating radio signals carrying information which has been encoded and modulated onto a carrier of either wide or narrow bandwidth for transmission, comprising subdividing the detected signals into detected sub-bands, superimposing the detected sub-bands into a plurality of components with a bandwidth similar to the sub-band bandwidth, processing that portion of the information contained in each component separately, and combining the processed information from the components to reconstruct the original information transmitted.

BRIEF DESCRIPTION OF THE DRAWINGS

FIG. 2 is a spectrum representation of the input signal Vin.

FIG. 3a and FIG. 3b are spectrum representations of the input signal Vin with the real and imaginary parts separated.

FIG. 4a, FIG. 4b, FIG. 4c, and FIG. 4d are spectrum representations of the components II, IQ, QI, and QQ which are the signal Vin after mixing each of the sub-bands with sin(wt) or cos(wt) and filtering each of the components.

FIG. 5a and FIG. 5b represent graphically the Vout++ vector which corresponds to the reconstruction of sub-band0 and sub-band1, and the Vout−+ vector which corresponds to the reconstruction of sub-band2 and sub-band3.

FIG. 6 is a schematic diagram of a Combiner circuit according to the instant invention.

DESCRIPTION OF THE PREFERRED EMBODIMENT

Figure 1:
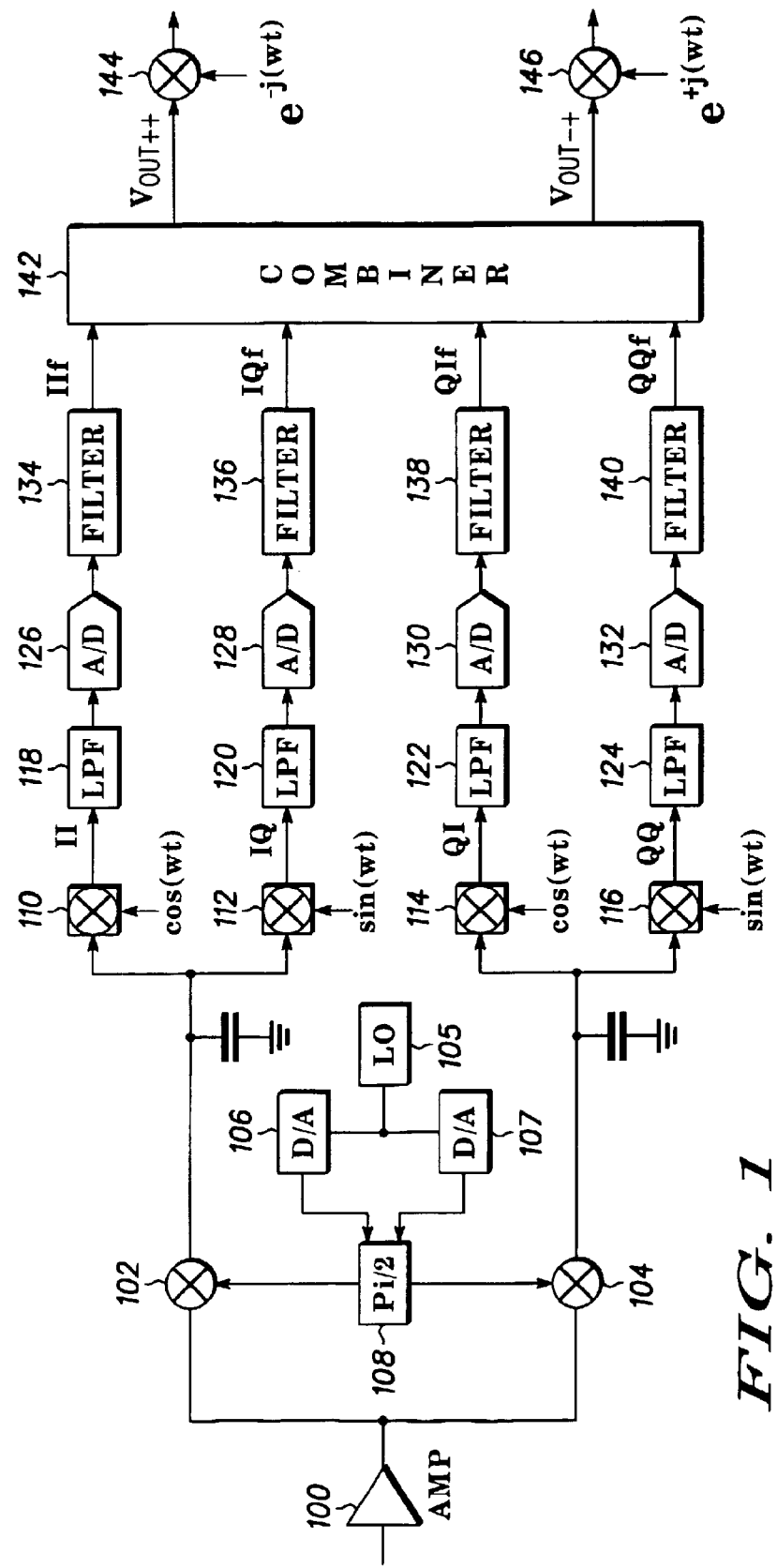
FIG. 1 is an overall block diagram of a communications receiver in accordance with the invention.
Figure 4B:
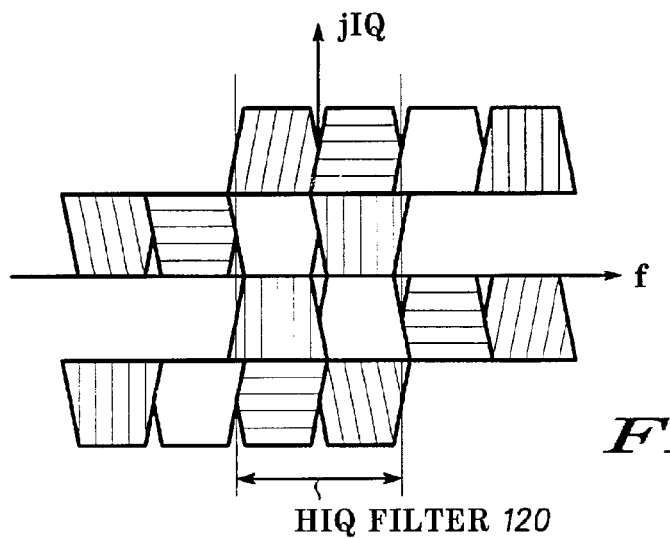
Figure 4C:
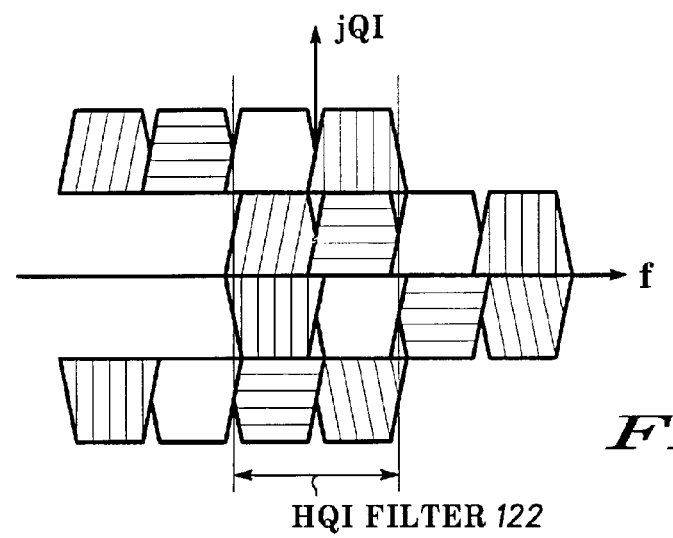
Figure 4D:
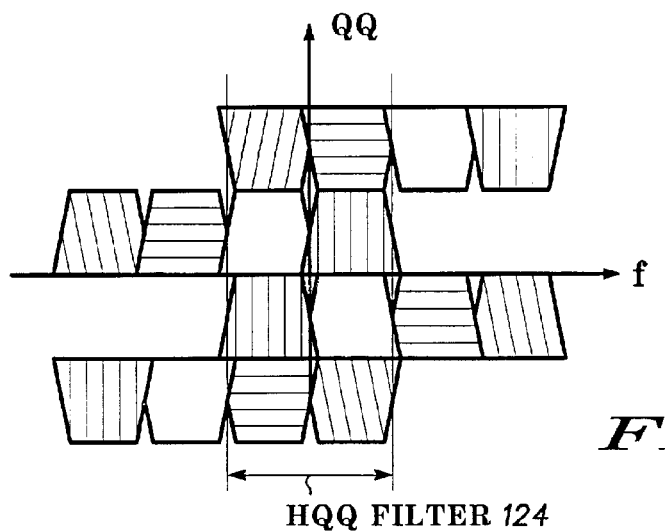

FIG. 1 is an overall block diagram of a communications receiver in accordance with the invention., An input signal Vin, which is a complex signal representing the baseband spectrum which will be translated to a Radio Frequency or Intermediate Frequency channel as earlier described, having information applied by a modulator in a transmitter to produce the input signal having In-phase and Quadrature-phase components, is applied to an amplifier 100 the output of which is applied to two quadrature mixers or downconverters 102, 104. Vin has a bandwidth of BW. Vin is subdivided into four sub-bands.

The IQ downconverters 102,104 downconverts either a Radio Frequency Signal (RF) or an Intermediate Frequency (IF) channel to DC spectrum using, for example, either a Gilbert Type of Mixer or a Chopper Type of Mixer.

A Local Oscillator 105 drives two digital to analog converters 106 and 107 to produce quadrature analog outputs (sin(wt) and cos(wt), where w=2*Pi*BW/4) which in turn drive quadrature network 108 which divides by Pi/2 in order to deliver two RF or IF oscillator signals which are in quadrature to feed the two Local Oscillator ports of the quadrature mixers 102,104.

The outputs of mixers 102 and 104 then are quadrature representations of the input signal Vin at baseband or a low Intermediate Frequency (hereafter references to baseband may alternatively imply low IF, depending on receiver design).

The outputs of the mixers 102 and 104 are filtered by a first low pass blocking filter (capacitors) and then are applied respectively to further mixers (multipliers) 110, 112, 114, and 116 where the I and Q sub-band components of bandwidth BW/2 are further divided into four components, II, IQ, QI, and QQ, of bandwidth BW/4 which are amplified and filtered by low pass filters 118, 120, 122, and 124 for further blocking filtering, each having a bandwidth equal to or greater than BW/4.

The mixers are low frequency mixers/multipliers except the I and Q IF or RF to baseband mixers 102 and 104. The mixers/multipliers 110,112,114 and 116 could be implemented as multiplier DAC's with gain, where the digital input port has the digital representation of cos(wt) and sin(wt) applied and the analog input port is the filtered output of the mixers 102 and 104. The clock frequency of the multiplier DAC depends on the amount of blocking provided in front to avoid spurious response at the harmonics of this clock. Also, this multiplier DAC could be used to set an Automatic Gain Control (AGC) signal in the receiver.

The Low pass filters are generally based on active RC type of filter with programmable cut-off frequencies such that wide-band or medium band or narrow band can be filtered. Those filters have a bandwidth equal to BW/4 which simplifies their design versus filters of bandwidth equal to BW/2 with similar blocking rejection requirements. This allows the filters to have a reduced number of poles required per filter that then introduces less group and amplitude ripple. Also, the programming cut-off frequency range is reduced.

The outputs of low pass filters 118, 120, 122, and 124 are subsequently applied to Analog to Digital converters 126, 128, 130, and 132, which may be Sigma-Delta A/D converters, and decimation filters 134, 136, 138, and 140 to produce component signals IIf, IQf, QIf, and QQf which will be described in detail later. The signals are gain and phase corrected and recombined at 142 to produce output signals Vout++ and Vout−+ which are subsequently demodulated and decoded to produce a digital bit stream representing the information previously encoded onto the complex input signal by the modulator of the transmitter.

The Analog to Digital converters 126, 128, 130, and 132 are preferably Sigma-Delta type A/D modulators with a programmable oversampling ratio for various wideband or medium or narrow band signal components. Since the components II, IQ, QI, QQ have their bandwidths reduced to BW/4 each, this reduces the required oversampling clock frequency of oversampling for the Sigma-Delta for the same Dynamic Range. For example, in WBCDMA mode with BW=3.84 Mhz, the oversampling clock would be selected in the range of 26 Mhz such that the oversampling ratio is in the range of 26 Mhz/(3.84 Mhz/4)=27.08 for 10 bits of resolution, while in GSM mode, the oversampling clock would be 13 Mhz for an oversampling ratio 13 Mhz/0.2 khz=65 for 14 bits of resolution.

The Sigma-Delta modulators 126,128,130 and 132 generate digital streams oversampled at specified frequencies of oversampling. These digital outputs will contain shaped noise spectrum depending on the order and the type of Sigma-Delta modulator as is typical for this kind of modulator. The digital outputs are then digitally filtered to remove the shaped noise of the Sigma-Delta modulators and then decimated to a lower clock frequency for further processing by decimation digital filters 134,136,138 and 140 operating at lower clock rates to perform selectivity filtering. The digital outputs IIf, IQf, Qif, and QQf are then processed by digital multipliers and adders in Combiner 142 in order to provide gain and phase imbalance correction and to generate four digital outputs components represented by vectors Vout++ and Vout−+.

The bandwidths of analog filters 118, 120, 122, and 124, the Sigma-Delta converters 126, 128, 130, and 132, and the digital decimation filters 134, 136, 138, and 140 can also be made programmable to handle several bandwidth settings.

In this preferred embodiment as shown in FIG. 1 a receiver is described in which the input signal is divided into four components, but it is understood that a different number of components may be used depending upon the bandwidth of the input signal and the desired bandwidth of the components.

The operation of the receiver of FIG. 1 can best be described with reference to the spectrum representations of the signals at various points in the receiver as set forth in FIGS. 2–5. An input channel applied to amplifier 100 is subdivided into four sub-bands hereafter referred to as sub0, sub1, sub2, and sub3 and referred to by reference numerals 160, 162, 164, and 166, respectively, in FIG. 2 which is a spectrum representation of Vin after having been divided into four sub-bands. Each of the sub-bands has a bandwidth of BW/4.

The RF channel on which those four sub-bands is based is downconverted from the RF or IF frequency to baseband in two components, I and Q, as the outputs of mixers 102 and 104, which are in quadrature phase relationship and where each component has a spectrum width of BW/2 (from 0 to BW/2).

If the vector Vin=I+j.Q is the representation of the input channel at baseband, then Vin can be expressed as a sum of four vectors that correspond to the four sub-bands, e.g., Vin=Vin0+Vin1+Vin2+Vin3. FIG. 2 also shows this representation where Vin0 corresponds to sub0, Vin1 corresponds to sub1, Vin2 corresponds to sub2, and Vin3 corresponds to sub3.

FIG. 3a and FIG. 3b show the spectrum of Vin represented in its constituent I and Q components (above the lines f). Thus are shown the real part of Vin, e.g., I=I0+I1+I2+I3, shown, respectively, as 160I, 162I, 164I, and 166I in FIG. 3b, and the imaginary part j.Q=j.Q0+j.Q1+j.Q2+j.Q3, shown, respectively, as 160Q, 162Q, 164Q, and 166Q in FIG. 3b.

As previously noted, then sub3, 166, is mixed with sub0, 160, sub2, 164, is mixed with sub1, 162, again looking separately at the I and j.Q spectra below the f lines.

Each component I and Q is then mixed with a low IF quadrature signals cos(wt) and sin(wt) in mixers 110, 112, 114, and 116 (where w=2.pi.BW/4 or a nearest value), i.e. the Low IF clock is half the I or Q bandwidth.

The operation is as follows:

$IIf=IIHII$ with $II=I\cos(wt)$ $IQf=IQHIQ$ with $IQ=I\sin(wt)$ $QIf=QIHQI$ with $QI=Q\cos(wt)$ $QQf=QQHQQ$ with $QQ=Q\sin(wt)$ Where HII, HIQ, HQI and HQQ are the transfer function of the analog and digital filters 118, 120, 122, and 124, and 134, 136, 138, and 140, respectively, on the II, IQ, QI and QQ paths respectively.

The ** denotes as a time domain convolution.

$II=I.(e^{+j(wt)}+e^{-j(wt)})/2$ $IQ=I.(e^{+j(wt)}-e^{-j(wt)})/2j$ $QI=Q.(e^{+j(wt)}+e^{-j(wt)})/2$ $QQ=Q.(e^{+j(wt)}-e^{-j(wt)})/2j$

Multiplying with $e^{+j(wt)}$ is equivalent to shift the spectrum by +w, i.e by +BW/4.

Multiplying with $e^{-j(wt)}$ is equivalent to shift the spectrum by −w, i.e by BW/4.

The result is the spectrum shown in FIG. 4a, FIG. 4b, FIG. 4c, and FIG. 4d which also graphically denotes the outputs of each of the filters 118, 120, 122, and 124, respectively, as II, IQ, QI, and QQ, each shown in the FIGS. As a filter of bandwidth BW/2 and the outputs of filters 134, 136, 138, and 140 as IIf, IQf, QIf, and QQf, respectively, also shown as filters of bandwidth W/2. The spectrum shifts as described above are also shown graphically in FIGS. 4. Note that each of the outputs of the filters in the II, IQ, QI, and QQ paths contains each of the four sub-bands, that is why the components II, IQ, QI, and QQ have the four sub-bands superimposed, as shown in FIG. 4a–FIG. 4d, and thus all the information originally contained within the input signal Vin is available to reconstruct the original signal, but the processing of the signals is at narrower bandwidths than the original signal Vin and thus can be performed with Sigma-Delta A/D converters rather than the flash or pipelined data converters usually used for this operation to support wide bandwidths.

To produce the output in the form of the reconstruction of the original (but now processed) information transmitted, the information of each of the four sub-bands must be recombined in Combiner 142 to form two vector components Vout++ and Vout−+:

$Vout++=(IIf-QQf)+j.(IQf+QIf)$ $Vout-+=(IIf+QQf)+j.(-IQf+QIf)$

Then the Vout++ vector corresponds to the reconstruction of sub-band0 and sub-band1, 160 and 162, and the Vout−+ vector corresponds to the reconstruction of sub-band2 and sub-band3, 164 and 166, as shown graphically in FIG. 5a and FIG. 5b, respectively. The recombination by Combiner 142 can be performed in several ways, for example:

Use an adder/subtractor to perform IIf−QQf=I++ for Vout++.

Use an adder/subtractor to perform IQf+QIf=Q++ for Vout++

Use an adder/subtractor to perform IIf+QQf=I−+ for Vout−+

Use an adder/subtractor to perform −IQf+QIf=Q−+ for Vout−+

The operation $Vout++e^{-j(wt)}$ is formed using a complex multiplier to perform the following digital operation: (I+++j.Q++).(cos(wt)−j.sin(wt))=I++.cos(wt)+Q++.sin(wt)+j.(−I++.sin(wt)+Q++.cos(wt)) using adders and multipliers.

The operation $Vout-+e^{j(wt)}$ is formed using a complex multiplier to perform the following digital operation: (I−++j.Q−+).(cos(wt)+j.sin(wt))=I−+.cos(wt)−Q−+.sin(wt)+j.(I−+.sin(wt)+Q−+.cos(wt)) using adders and multipliers.

Note that all four of the components IIf, IQf, QIf, and QQf are required to reconstruct each sub-band. It is required that all four components be available to recover the sub-band separately. Each component (II, IQ, QI, and QQ) contains within the BW/4 information related to all the four sub-bands as shown in their respective spectrum. That is what allows the receiver to process all four sub-bands in parallel and allows the use of more favorable A/D conversion techniques. For this reason the receiver can be referred to as a Double Cartesian receiver since the four components are required to reconstruct each sub-band.

Note also that those four real components have a spectrum width of BW/4 and that the same low pass filters with the same low pass A/D converters are required to digitize those four components.

The receiver employing the instant invention could be seen as a receiver having an RF or IF input channel of bandwidth BW with four baseband output components (Double Cartesian) called IIf, QQf, QIf, and IQf that have a bandwidth requirement of BW/4. To reconstruct back the original spectrum, the two reconstructed vector Vout++ and Vout−+ needed to be shifted by −w and by +w respectively, and so are multiplied, respectively by $e^{-j(wt-phi0)}$ and $e^{+j(wt-phi0)}$:

$Vout\ r=Vout++.e^{-j(wt-phi0)}+Vout-+.e^{+j(wt-phi0)}$

Where phi0 is chosen to remove phase discontinuities. Since Sin(wt) and cos(wt) need to be generated, the phase generator that generated sin(wt) and cos(wt) simply starts with an offset of −phi0.

By replacing Vout++ and Vout−+ by their expressions we get:

$Vout\ r=2(IIf.\cos(wt-phi0)+IQf.\sin(wt-phi0))+2j.(QIf.\cos(wt-phi0)+QQf.\sin(wt-phi0))$ i.e., the reconstruced In-phase and Quadrature components are:

$Ir=(IIf.\cos(wt-phi0)+IQf.\sin(wt-phi0))$ $Qr=(QIf.\cos(wt-phi0)+QQf.\sin(wt-phi0))$ A reconstruction implementation of Combiner 142 is shown in FIG. 6 to generate the real and imaginary output of the reconstructed vector Vout r in accordance with the equations set forth above and also provide gain and phase correction for mismatches introduced by the four paths. The recombination equations Ir=(IIf.cos(wt–phi0)+IQf.sin(wt–phi0)) and Qr=(QIf.cos(wt–phi0)+QQf.sin(wt–phi0)) implemented in FIG. 6 also use gain and phase corrections between the components when they do not match among themselves.

IIf is mutliplied by the gain correction term Kii, IQf is multiplied by the gain correction term Kiq, QQf is multiplied by the gain correction term Kqq and QIf is multiplied by the gain correction Kqi by multipliers 170, 172, 174, and 176, respectively. The gain corrections terms are chosen such the corrected terms are equal in amplitude.

It is still necessary to correct the phase between the IIf, IQf, Qif, and QQf. Rather than multiplying, for example, IIf by cos(wt–phi0), it is multiplied by cos(wt–phi0+PhiIQ) in multiplier 178 where PhiIQ is a phase value used to phase shift IIf versus IQf to compensate the phase mismatch between IIf and IQf. Similarly, the term PhiQI is the phase correction to compensate the phase mismatch between QIf and QQf applied in multiplier 180.

Once IIf and IQf are gain and phase matched, and QIf and QQf are gain and phase matched, (IIf v,IQf), the output of the adder 182, and (QQf,QIf), the output of the adder 184, must be matched in phase. This is done by adding to the output of adder 182 a term Kri which is the output of adder184. This is explained simply by the equation:

$$\cos(wt+PhiIR)=\cos(wt)\cos(PhiIR)+\sin(wt).\sin(PhiIR)$$

This means that to correct by a phase value PhiR, the imaginary part sin(wt) (addder 184 output) is taken and is multiplied by Kri=sin(PhiIR) and added to the adder 182 output cos(wt).cos(PhiIR). The operation of multiplication by cos(PhiIR) may be done before the adder 182 by changing Kii'=Kii.cos(PhiIR) and Kiq'=Kiq.cos(PhiIR) to save a multiplier.

Therefore, Ir=Kii.cos(PhIR).Iff.cos(wt–phi0+PhiIQ)+ Kiq.cos(PhiIR).IQf.sin(wt–phi0)+Qr.Kri and Qr=Kqq.QQf.sin(wt–phi0–PhiQI)+Kqi.QIf.cos(wt–phi0)

When the received signal has a narrow bandwidth or a medium bandwidth (both of which may be termed for purposes of this description as narrowband, since they are narrow relative to the wideband signal previously discussed), like BW/2 rather than BW (for example a GSM cellular telephone signal), then two of the component branches of the receiver can be switched OFF while the other two branches are left ON with the digital Local Oscillator set to 0 or used to set gain control (AGC). (i.e, cos(wt)=1 or cos(wt)=AGC and sin(wt)=0). This then functions as a single Cartesian receiver.

Figure 7:
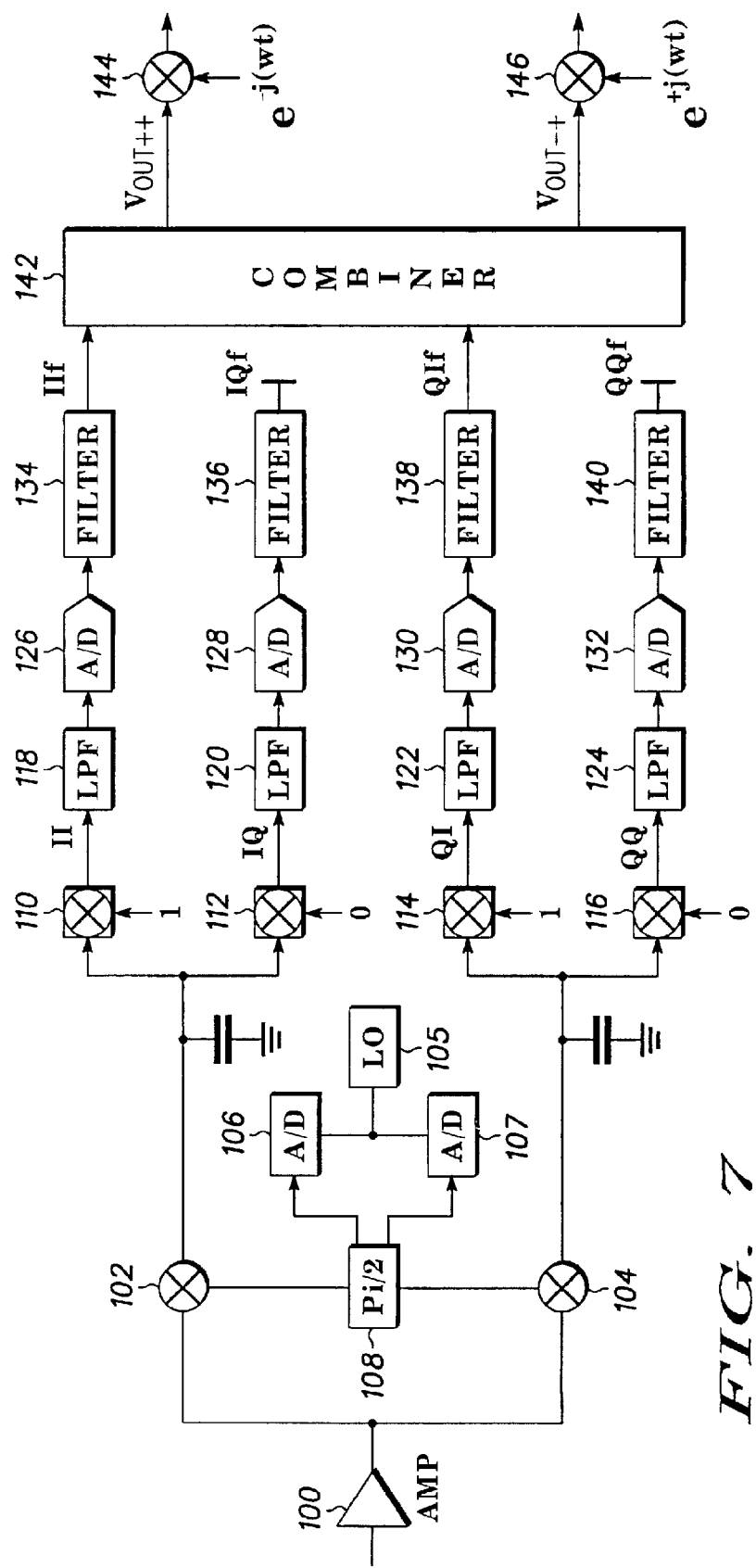
FIG. 7 is an overall block diagram of a communications receiver in accordance with the invention showing the configuration of the receiver for reception of narrow or medium bandwidth signals.

The receiver of FIG. 1 is shown in FIG. 7 in such a mode. As shown in FIG. 6, the input to the receiver of FIG. 7 is operated the same as that of FIG. 1, that is, the Local Oscillator 105, and Local Oscillator quadrature generator 108 produce the same signals as earlier described, as do mixers 102 and 104 which serve to reduce the input channel to baseband and divide the spectrum into its I and Q quadrature components. In the receiver of FIG. 6, however, the IQ and QQ paths are disabled by multiplying the input signals thereto by 0. This allows only two paths to remain active, one path for each of the I and Q components of the complex, but narrow, or narrower, band input signal.

The active paths II and QI filter the input channel in analog low-pass filters 118 and 122, respectively, perform analog to digital conversions in A/D converters 126 and 130 (which may be Sigma-Delta converters), and provide digital filtering in filters 134 and 138 to produce output signals Iout and Qout which are then employed to derive the originally encoded information encoded by the transmitter.

As can be seen, in this manner both wideband and narrow band signals can be processed by the same receiver components and duplication of elements and data paths is avoided.

As previously noted, in this preferred embodiment a receiver is described in which the input signal is divided into four components (or two components in the case of medium or narrow bandwidth signals), but it is understood that a different number of components may be used depending upon the bandwidth of the input signal and the desired bandwidth of the components.

What is claimed is:

1. A communications receiver adapted to receive and process information transmitted as either a wide band signal or a narrow band signal having In-phase-Quadrature-phase (IQ) modulation of a carrier, comprising:

means for detecting a portion of the spectrum wide enough to encompass the bandwidth (BW) of a wide band carrier signal means for converting the wide band carrier to baseband in I and Q components, each component having a bandwidth of BW/2, and for converting the I and Q components into further I and Q components to form sub-components II, IQ, QI, and QQ, where each of the sub-components has a bandwidth of BW/4- and may contain a portion of the originally transmitted information, means operable in a wideband mode for separately processing each of the sub-components to extract portions of the originally transmitted information, and means operable in a narrowband mode for separately processing each of the sub-components containing information within the narrow band transmitted carrier to extract portions of the originally transmitted information, and means for recombining the extracted information to reconstruct the originally transmitted information.

2. A communications receiver as set forth in claim 1 wherein the means for converting the wide band carrier to baseband in I and Q components comprises means for mixing the radio signal with a single local oscillator output to downconvert the radio signal to the frequency at which the processing is to occur, and subsequently dividing the downconverted signal into the sub-components for independent and simultaneous processing.

3. A communications receiver as set forth in claim 2 wherein the means for converting the wide band carrier to baseband in I and Q components comprises means for mixing the downconverted signal with locally generated signals to produce the sub-components.

4. A communications receiver as set forth in claim 3 where the mixing with the locally generated signals uses multiplier DAC's with the digital input driven by the low frequency digital local oscillator signals.

5. A communications receiver as set forth in claim 4 where the multiplier DAC's provide Gain Control for Automatic Gain Adjustment.

6. A communications receiver as set forth in claim 3 wherein the means for processing that portion of the information contained in each of the sub-components comprises an analog to digital converter.

7. A communications receiver as set forth in claim 6 wherein the analog to digital converter is a sigma-delta analog to digital converter with a programmable oversampling ratio for Wideband or Narrow band conversion.

8. A communications receiver as set forth in claim 1 wherein the means for converting the wide band carrier to baseband in I and Q components comprises means for mixing the radio signal with a single local oscillator output to downconvert the radio signal to an intermediate frequency, and subsequently dividing the downconverted signal into the sub-components for independent and simultaneous processing.

9. A method for receiving and processing information transmitted on either a wide band carrier or a narrow band carrier having In-phase-Quadrature-phase (IQ) modulation, comprising:

detecting a portion of the spectrum wide enough to encompass the bandwidth (BW) of a wide band carrier (BW), converting the wide band carrier to baseband in I and Q components, each component having a bandwidth of BW/2, converting the I and Q components into further I and Q components to form sub-components II, IQ, QI, and QQ, where each of the sub-components have a bandwidth of BW/4 and may contain a portion of the originally transmitted information, in a wideband mode, separately processing each of the sub-components to extract portions of the originally transmitted information, and in a narrowband mode, separately processing each of the sub-components containing information within the narrow band transmitted carrier to extract portions of the originally transmitted information, recombining the extracted information to reconstruct the originally transmitted information; and where the paths of two sub-components are disabled in Narrow band mode.

10. A method as set forth in claim 9 wherein converting the wide band carder to baseband in I and Q components comprises mixing the radio signal with a single local oscillator output to downconvert the radio signal to the frequency at which the processing is to occur and subsequently dividing the downconverted signal into sub-components for independent and simultaneous processing.

11. A method as set forth in claim 10 wherein converting the wide band carrier to baseband in I and Q components comprises mixing the downconverted signal with locally generated signals to produce the sub-components.

12. A method as set forth in claim 11 wherein processing that portion of the information contained in each of the sub-components comprises an analog to digital conversion.

13. A method as set forth in claim 12 wherein the analog to digital conversion is a sigma-delta analog to digital conversion with a programmable oversampling ratio for Wideband or Narrow band processing.

14. A method as set forth in claim 9 wherein converting the wide band carrier to baseband in I and Q components comprises mixing the radio signal with a single local oscillator output to downconvert the radio signal to an intermediate frequency and subsequently dividing the downconverted signal into the sub-components for independent and simultaneous processing.

15. A method as set forth in claim 9 where Digital gain and phase correction for the four sub-components is performed in combination with the complex mixing with the digital local oscillator during the recombination process.

16. A method as in claim 15 where Phase discontinuity is removed by phase shifting the digital local oscillator during the recombination process.

* * * * *

UNITED STATES PATENT AND TRADEMARK OFFICE
CERTIFICATE OF CORRECTION

PATENT NO. : 6,931,241 B2  Page 1 of 1
APPLICATION NO. : 09/746692
DATED : August 16, 2005
INVENTOR(S) : Nadim Khlat et al.

It is certified that error appears in the above-identified patent and that said Letters Patent is hereby corrected as shown below:

Column 10, Line 4, Claim No. 10:
  Change "the wide band carder" to --the wide band carrier--

Column 10, Line 8, Claim No. 10:
  Change "into sub-components" to --into the sub-components--

Signed and Sealed this

Sixth Day of May, 2008

JON W. DUDAS
*Director of the United States Patent and Trademark Office*